United States Patent
Wu (10) Patent No.: US 11,228,306 B2
(45) Date of Patent: Jan. 18, 2022

(54) POWER SWITCH OVER-POWER PROTECTION

(71) Applicant: Diodes Incorporated, Plano, TX (US)

(72) Inventor: Wei Wu, Freemont, CA (US)

(73) Assignee: Diodes Incorporated, Plano, TX (US)

(*) Notice: Subject to any disclaimer, the term of this patent is extended or adjusted under 35 U.S.C. 154(b) by 328 days.

(21) Appl. No.: 16/046,991

(22) Filed: Jul. 26, 2018

(65) Prior Publication Data

US 2019/0036521 A1  Jan. 31, 2019

Related U.S. Application Data (60) Provisional application No. 62/537,954, filed on Jul. 27, 2017.

(51) Int. Cl.
| | | |
|---|---|---|
| H03K 17/082 | (2006.01) | |
| H03K 5/24 | (2006.01) | |
| H03K 5/26 | (2006.01) | |
| H03K 3/037 | (2006.01) | |
| G01R 19/255 | (2006.01) | |

(52) U.S. Cl.
CPC ......... *H03K 17/0822* (2013.01); *H03K 3/037* (2013.01); *H03K 5/24* (2013.01); *H03K 5/26* (2013.01); *G01R 19/255* (2013.01); *H03K 2217/0054* (2013.01)

(58) Field of Classification Search
CPC ........ H03K 17/0822; H03K 5/26; H03K 5/24; H03K 19/255; H03K 2217/0054; H03K 17/08; H03K 17/081; H03K 17/08104; H03K 17/0812; H03K 17/08122; H03K 17/12; H03K 17/122; H02H 3/08; H02H 3/26; H02H 3/32; H02H 9/00; H02H 9/02; H02H 9/025
See application file for complete search history.

(56) References Cited

U.S. PATENT DOCUMENTS

| | | | | |
|---|---|---|---|---|
| 5,773,945 A | * | 6/1998 | Kim ....................... | H02H 7/085 318/434 |
| 7,149,098 B1 | * | 12/2006 | Chen ....................... | H02M 1/32 363/56.09 |
| 2002/0012216 A1 | * | 1/2002 | Ohshima ............ | H03K 17/0822 361/93.1 |
| 2004/0070910 A1 | * | 4/2004 | Gergintschew .... | H03K 17/0822 361/103 |
| 2004/0207967 A1 | * | 10/2004 | Ohshima ............ | H03K 17/0822 361/93.1 |
| 2006/0023383 A1 | * | 2/2006 | Thiery ................... | H02H 3/093 361/100 |
| 2006/0158817 A1 | * | 7/2006 | Oshima .................. | H02H 3/087 361/140 |
| 2006/0187604 A1 | * | 8/2006 | Ohshima ............ | H03K 17/0822 361/100 |

(Continued)

*Primary Examiner* — Gustavo A Rosario-Benitez
(74) *Attorney, Agent, or Firm* — Kilpatrick Townsend & Stockton (57) ABSTRACT

An over-power protection circuit for a MOSFET includes an over-current protection circuit and a current limit setting circuit, and an over-power protection circuit configured to continuously monitor a voltage across the MOSFET being protected to prevent over-power conditions, and to dynamically determine a maximum current limit based on the monitored voltage and a pre-set maximum power limit.

18 Claims, 8 Drawing Sheets

(56) References Cited

U.S. PATENT DOCUMENTS

| | | | |
|---|---|---|---|
| 2012/0106013 A1* | 5/2012 | Yang | H02H 7/18 |
| | | | 361/87 |
| 2013/0163136 A1* | 6/2013 | Chang | H02H 3/006 |
| | | | 361/87 |
| 2014/0043867 A1* | 2/2014 | Sugawara | H02M 3/33507 |
| | | | 363/21.15 |
| 2015/0323573 A1* | 11/2015 | Voelzke | G01R 21/00 |
| | | | 324/142 |
| 2015/0326000 A1* | 11/2015 | Kanzaki | H02H 7/1257 |
| | | | 361/101 |
| 2016/0336847 A1* | 11/2016 | Kim | H02M 3/33523 |
| 2018/0088615 A1* | 3/2018 | Mori | H03K 17/0828 |

\* cited by examiner

Time-to-Voltage Converter

FIG. 6

FIG. 7  Voltage-to-Current Converter

FIG. 8

POWER SWITCH OVER-POWER PROTECTION

CROSS REFERENCES TO RELATED APPLICATIONS

This application claims priority to U.S. Provisional Patent Application No. 62/537,954, filed on Jul. 27, 2017 and entitled "POWER SWITCH OVER-POWER PROTECTION" the disclosure of which is hereby incorporated by reference in its entirety for all purposes.

BACKGROUND

The present invention is directed to integrated circuits. More particularly, the invention provides a system and method for over-current protection and over-power protection of a protected device.

In electronic circuits, over-current protection circuits are widely used. In an over-current protection circuit, a power device, e.g., a power MOSFET (Metal-Oxide-Semiconductor field effect transistor), is often used in a protection circuit to protect a load device against over-current conditions. The over-current protection circuit monitors the current flowing through the power device, and compares the measured current with a pre-set maximum allowable current to determine an over-current condition. In normal operations, the on-resistance RN of the power switch is kept low to allow current flow to the load device. When an over-current condition is detected, the protection circuit increases the on-resistance to reduce the voltage and current delivered to the load device.

The inventor has recognized a drawback with conventional over-current protection circuits. In an over-current event, the electrical power being consumed by the power device in the over current protection circuit can rise above the power limit. The situation is much worse in high voltage applications because in the same over current ratio (required output load current vs limited output load current), voltage at a high voltage (e.g., 20 V) can be several times as large than at a low voltage (e.g., 5 V). The power consumed on power switch can be several times larger as well, causing the power MOSFET more likely to operate beyond the specified condition in the SOA (Safer Operating Area). A Power MOSFET operating beyond its power limit can degrade its performance, reduce its life time, and can even be damaged. Therefore, conventional over-current protection circuits are not satisfactory in protection against over-power conditions.

BRIEF SUMMARY OF THE INVENTION

Conventional over-current protection circuit usually has a pre-set current limit for the device being protected. However, there is often no provision to protect against over-power conditions. The pre-set current limit is often determined for safe device operation under normal operating voltages. As described above, when an over-current event happens, the on-resistance Ron of the power MOSFET is increased by the protection circuit in order to limit the current, and reduce the output voltage across a load. However, the voltage across the power MOSFET is raised because of the higher Ron. In another example, if the load device has been operating with a current below an over-current condition, and the load resistance drops, the voltage of the power MOSFET is increased. As a result, the power consumption can increase beyond what is expected from a device under normal operation. Power consumed on the power MOSFET is the product of current through it and voltage cross it. The heavier the over current, the larger the voltage, then the higher the power consumption.

This invention teaches an over-power protection circuit and method, in which the voltage across a power device, e.g., an MOSFET, is monitored, and a maximum current limit $I_{CAL}$ is determined based on a pre-defined power limit threshold $P_{LMT}$. The maximum current limit $I_{CAL}$ can be calculated by the power limit threshold $P_{LMT}$ divided by the voltage across the power MOSFET. The power limit threshold $P_{LMT}$ can be determined based on the SOA requirement. The maximum current limit $I_{CAL}$ can vary with the voltage across the MOSFET.

Therefore, a constant worst case current limit may be overly restrictive. The over-power protection device continuously monitor the voltage across the MOSFET, and dynamically determines a suitable maximum current limit $I_{CAL}$ based on the monitored voltage across the device being protected to prevent over-power conditions.

An over-power protection circuit includes an over-current protection circuit that is configured to sense a current flowing through the device, compare the sensed current with a pre-set current limit, and prevent the current through the device from exceeding the current limit. The over-power protection circuit also includes a current limit setting circuit that is configured to provide a current limit $I_{LMT}$ to the over-current protection circuit. The current limit can be either a pre-set current limit $I_{SET}$, which can be determined from the device specification, or a current limit $I_{CAL}$ based on the power limit of the device. As descried above, the current limit $I_{CAL}$ can be a maximum current allowed to go through power MOSFET that is calculated from a pre-defined power limit threshold $P_{LMT}$ divided by the voltage across the power MOSFET.

According to some embodiments, a protection circuit includes an over-current protection circuit for coupling to a protected device, the protected device having a pre-set maximum current limit and a pre-set maximum power limit. The protection circuit also includes a current limit setting circuit coupled to the over-current protection circuit and the protected device, the current limit setting circuit configured to provide a target current limit signal to the over-current protection circuit for limiting current through the protected device. The target current limit signal is the lower one of the pre-set maximum current limit, and a current indicator signal determined based on the pre-set maximum power limit and a voltages across the protected device.

In an embodiment of the above protection circuit, values for circuit components in the over-current and over-power protection circuit are selected so that the current indicator signal represents a maximum current allowed based on the pre-set maximum power limit for a measured voltage across the protective device.

According to some embodiments, an over-power protection circuit for a MOSFET includes an over-current protection circuit and a current limit setting circuit, and an over-power protection circuit configured to continuously monitor a voltage across the MOSFET being protected to prevent over-power conditions, and to dynamically determine a maximum current limit based on the monitored voltage and a pre-set maximum power limit.

In some embodiments, the over-current protection circuit is configured to sense a current flowing through a protected device; compare the sensed current with a target current limit; and limit the current through the protected device to below the target current limit. The current limit setting circuit is configured to provide the target current limit to the over-current protection circuit, wherein the target current limit is either a pre-set current limit from a device specification, or a second current limit based on a pre-defined power limit.

According to some embodiments of the invention, an inverse voltage-to-current conversion circuit is provided for producing a current that is inversely related to an input voltage. The circuit includes a first input terminal and a second input terminal for receiving the input voltage between the first and the second input terminals. The circuit further includes a voltage-to-time converter circuit for providing a time indicator pulse signal with a pulse width related to inverse magnitude of the input voltage, and a time-to-voltage converter circuit for providing a voltage indicator signal having a magnitude based on the pulse width of the time indicator pulse signal. The circuit also includes a voltage-to-current converter circuit for providing a current indicator signal having a magnitude proportional to the voltage indicator signal, the current indicator signal being inversely related to the magnitude of the input voltage.

According to some embodiments of the invention, a method is provided for producing a current that is inversely proportional to a first voltage. The method includes sensing a first voltage across a first terminal and a second terminal, forming a voltage pulse signal with a pulse width inversely related to a magnitude of the first voltage, forming a second voltage having a magnitude based on a length of the voltage pulse signal, and forming a current signal having a magnitude proportional to the second voltage. The current signal is configured to have a magnitude inversely related to the first voltage.

Definitions

The terms used in this disclosure generally have their ordinary meanings in the art within the context of the invention. Certain terms are discussed below to provide additional guidance to the practitioners regarding the description of the invention. It will be appreciated that the same thing may be said in more than one way. Consequently, alternative language and synonyms may be used.

A power switch as used herein refers to a semiconductor switch, for example, a transistor, that is designed to handle high power levels.

A power MOSFET is a specific type of metal oxide semiconductor field-effect transistor (MOSFET) designed to handle significant power levels. An example of a power MOSFET for switching operations is called double-diffused MOS or simply DMOS.

A regulator or voltage regulator is a device for automatically maintaining a constant voltage level.

A constant-current regulator is a regulator that provides a constant output current. A constant current or constant voltage is understood to be a current or voltage that maintains a constant value with a range of deviation depending on design and manufacturing process variations or within a limitation according to a specification, for example, within ±10%, ±5%, or ±1%.

An operational amplifier (op-amp or opamp) refers to a DC-coupled high-gain electronic voltage amplifier with a differential input and, usually, a single-ended output. An operational amplifier can be characterized by a high input impedance and a low output impedance, and can be used to perform mathematical operations in analog circuits.

A voltage reference or a reference voltage source is an electronic device that ideally produces a fixed (constant) voltage irrespective of the loading on the device, power supply variations, temperature changes, and the passage of time.

A reference voltage is a voltage value that is used as a target for a comparison operation.

A current reference or a reference current source is an electronic device that ideally produces a fixed (constant) current irrespective of the loading on the device, power supply variations, temperature changes, and the passage of time.

A reference current is a current value that is used as a target for a comparison operation.

A sensed signal is a voltage or current signal determined by a sensing circuit.

When the term "the same" is used to describe two quantities, it means that the values of two quantities are determined the same within measurement limitations.

DETAILED DESCRIPTION OF THE INVENTION

Electronics devices, such as power MOSFETs, are usually designed to operate within its Safe Operation Area (SOA), which defines, among other things, how long a power MOSFETs can operate with a certain current flowing through it under a certain voltage. In embodiments of the invention, circuits and methods are provided using an over-current protection circuit to also provide over-power protection, i.e., to limit the power consumed in the power MOSFET to within the pre-set maximum power limit to protect the power MOSFET from performance degradation, short life time, and damages.

In some embodiments, the voltage across a power switch is monitored, and a safe current limit is determined from a power limit. The power limit can be determined, for example, from the Safe Operation Area (SOA) of the device.

Given a power limit, the higher the voltage across the device, the lower the allowable current.

Figure 1:
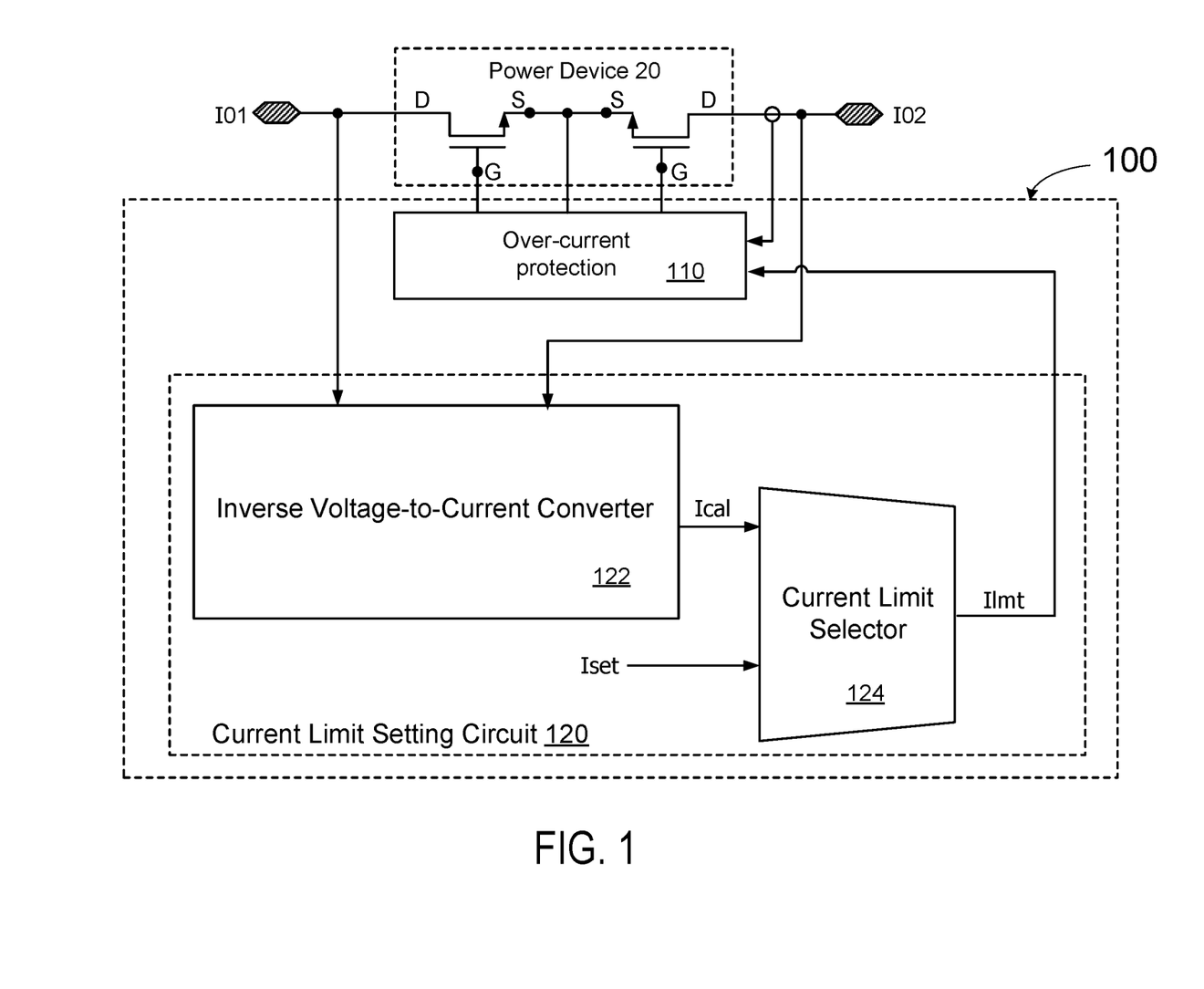
FIG. 1 is a simplified schematic diagram illustrating an over-power protection circuit for protecting a power device that embodies certain aspects of this invention.

FIG. 1 is a simplified schematic diagram illustrating an over-power protection circuit for protecting a power device that embodies certain aspects of this invention. A power device is often used as a switch between a power supply and a load device for controlling the power provided to the load device. For example, in FIG. 1, a power device 20 can have a first terminal IO1 for coupling to a power supply and a second terminal IO2 for coupling to a load device. The power device 20 can include a single power transistor or a combination of power transistors. The power device can be a bipolar transistor or an MOSFET. In the example of FIG. 1, power device 20 represents an MOS power device being protected by an over-power protection circuit 100. In this particular example, power device 110 includes the combination of two power MOSFETs 111 and 112, each having a drain (D), source (S), and gate (G) terminals. It is understood that the circuits and methods described here are applicable to any device that needs to be protected against over-power conditions. In the description below, the device being protected, such as power device 20, is also referred to as the protected device.

As shown in FIG. 1, the over-power protection circuit 100 includes an over-current protection circuit 110 that is configured to sense a current flowing through the power device 20, compare the sensed current with a current limit, and prevent the current flowing through the power device from exceeding the current limit. The over-power protection circuit also includes a current limit setting circuit 120 that is configured to provide a current limit $I_{LMT}$ to the over-current protection circuit 110. The current limit can be either a pre-set current limit $I_{SET}$, which can be determined from the device specification, or a current limit $I_{CAL}$ based on the power limit of the power device and a measured current flowing through the power device. As descried above, the current limit $I_{CAL}$ can be a maximum current allowed to flow through power device, which can be determined from a pre-set maximum power limit threshold $P_{LMT}$ divided by the voltage crossing the power MOSFET. For example, the power limit threshold $P_{LMT}$ can be determined based on its SOA requirement.

As shown in FIG. 1, the current limit setting circuit 120 can include an inverse voltage-to-current converter 122 and a current limit selector circuit 124. The inverse voltage-to-current conversion circuit 122 is configured for sensing a voltage across two terminals of the protected device, e.g., power device 20, and provide a current that is inversely related to the voltage across the two terminals of the protected device. As described above, given a power limit $P_{LMT}$, the maximum current allowed in the device is inversely proportional to the voltage across the device. The output current of the inverse voltage-to-current conversion circuit $I_{CAL}$ is the maximum allowed current based on the sensed voltage. The current limit setting circuit 120 also includes a current selector circuit 124 for selecting a current limit $I_{LMT}$ from either the $I_{CAL}$ described above or a current $I_{SET}$, which is a pre-et current limit for the over-current protection circuit, which may be based on the current carrying capability of the device, and may not include considerations for over-power protection.

In embodiments of the invention, values for circuit components in the over-current and over-power protection circuit are selected so that the current indicator signal represents a maximum current allowed based on the pre-set maximum power limit for a measured voltage across the protective device. More details are described below.

Figure 2:
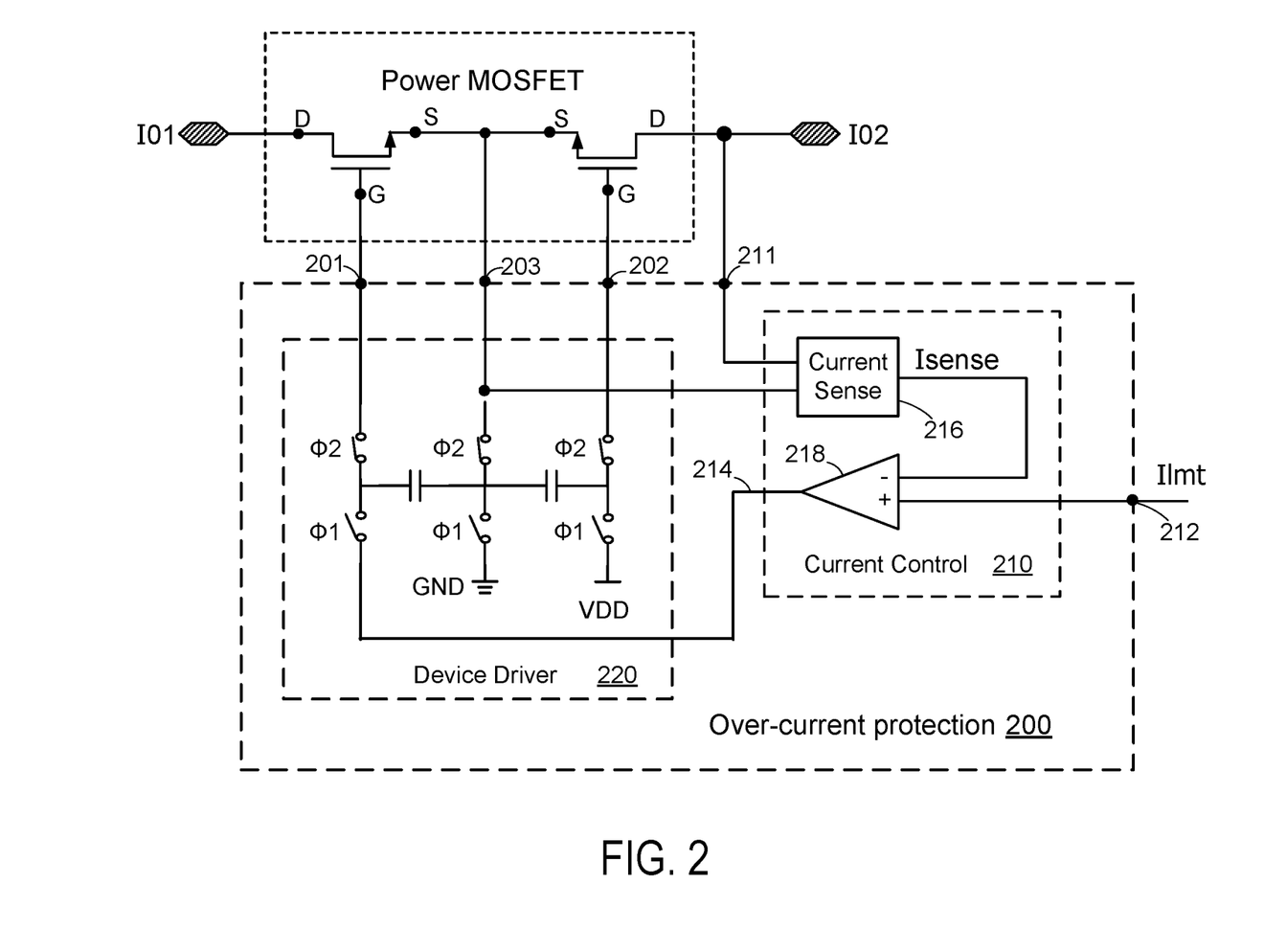
FIG. 2 is a simplified schematic diagram illustrating an over-current protection circuit that embodies certain aspects of this invention.

FIG. 2 is a simplified schematic diagram illustrating an over-current protection circuit that embodies certain aspects of this invention. Over-current protection circuit 200 in FIG. 2 is an example of circuits which can be used as the over-current protection circuit 110 in FIG. 1. The over-current protection circuit 200 includes a current control circuit 210 and a device driver circuit 220. In can be seen that over-current protection circuit 200 has two output terminals 201 and 202 coupled to the gates of the MOSFETs and a third output terminal 203 coupled to the source terminals of the power MOSFET for driving the MOSFETS. The over-current protection circuit 200 also has a first input terminal 211 for current sensing and a second input terminal 212 for receiving a target current limit signal $I_{LMT}$.

The current control circuit 210 generates a current control signal in response to comparing a sensed current signal in the protected device with the target current limit signal. In FIG. 2 current control circuit 210 compares the current sensed the current Isense in the power MOSFET with the current limit $I_{LMT}$ from the inputs and generates current control signal 214, which is used to modify the gate drive voltage according to the comparison result to change the bias of the MOSFET and the current and voltage of the power MOSFET in order to limit the current and power in a load device.

The current control circuit 210 includes a current sense circuit 214 to sense current through power MOSFET by monitor voltage cross the output power MOSFET near the IO2 terminal. Since the Rdson of a power MOSFET is pre-defined and designed, the voltage across the output power MOSFET Vds is equal to I×Ron, the sensed current Isense can be converted from Vds by a voltage to current converter.

A conventional current sense circuit can also be used. As an example, a small sampling MOSFET much smaller than the power MOSFET, for example, by a ratio of 1000:1, can be biased with the same drain, source, and gate voltages as the power MOSFET and provides a sensed current that represents the current through the power MOSFET.

In FIG. 2, current control circuit 210 includes a comparator circuit 218 with input signals Isense and $I_{LMT}$. Isense is a sensed current signal that represents a current flowing through the power MOSFETS, and $I_{LMT}$ is a target current limit signal that triggers a current protection action. The output of the current control circuit 210 is fed to device driver circuit 220 to reduce the current in the power MOSFET. In some embodiments, comparator circuit 215 can include a current comparator that receives two input current signals Isense and $I_{LMT}$ and produces a current control signal 214, which can be a voltage signal having a low value and a high value for driving the gate of the MOSFET. For example, the high voltage value can be a power supply voltage VDD, and a low voltage value can be a preset safe gate voltage to allow a safe current in the MOSFET.

The device driver circuit 220 can includes a charge-pump driver having two separate charge-pumps. The charge pump driver can include multiple capacitors and switches. The charge pump for input power MOSFET (connected to terminal IO1) is for current limit control, so the Vgs can be reduced and regulated when an over-current event occurs. The charge pump for output power MOSFET (connected to terminal IO2) is directly connected to a power supply VDD, so that this MOSFET is fully turned on.

Charge pump gate driver illustrates the gate drive circuit for the power MOSFET close to the input terminal. When the sensed power MOSFET current Isense reaches the current limit, the gate driver circuit switches the gate drive voltage to a preset safe gate voltage.

As shown in FIG. 2, in the first time interval, timing signal Φ1 closes two switches to charge the capacitor to a voltage, for example, VDD at 5V, when there is no over-current or over-power condition. When the over-current or over-power condition is met, signal Φ2 closes corresponding switches changing the $V_{DS}$, to the voltage of the capacitor, which ensures a safe current through the MOSFET.

Figure 3:
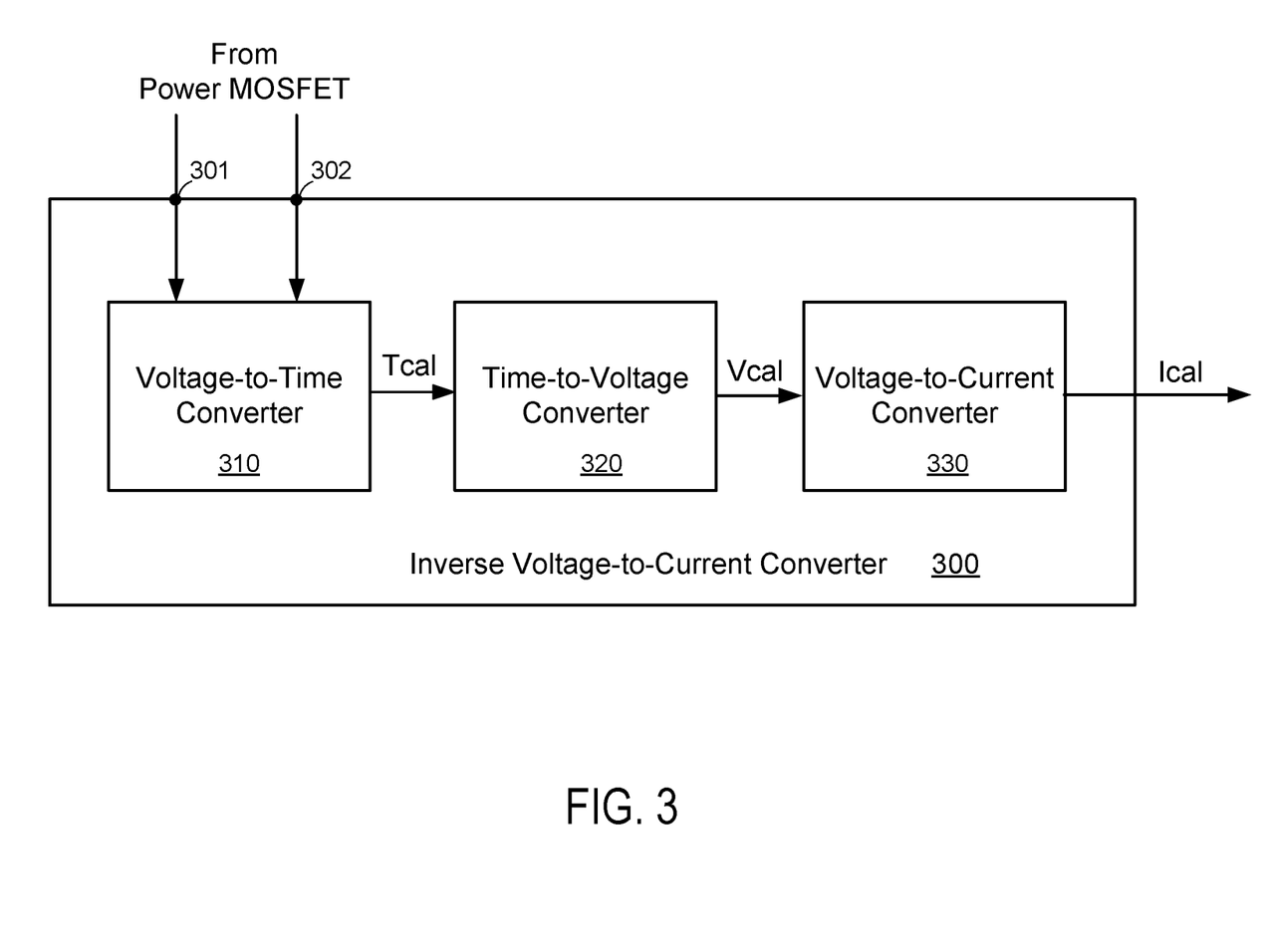
FIG. 3 is a simplified schematic diagram illustrating a voltage-to-current converter circuit for providing an output current $I_{CAL}$ that is inversely related to an input voltage that embodies certain aspects of this invention.

FIG. 3 is a simplified schematic diagram illustrating a voltage-to-current converter circuit for providing an output current $I_{CAL}$ that is inversely related to an input voltage that embodies certain aspects of this invention. The voltage-to-current converter circuit 300 in FIG. 3 can be used as the inverse voltage-to-current converter circuit 122 of FIG. 1. As shown in FIG. 3, inverse voltage-to-current converter circuit 300 includes a first terminal 301 and a second terminal 302 for receiving a first input voltage signal and a second input voltage signal from the protected device, e.g., a power MOSFET. Thus, the difference between the first input voltage signal and the second input voltage signal represent a voltage across the first and second terminals. Inverse voltage-to-current converter circuit 300 also include a voltage-to-time converter circuit 310 for providing a time indicator pulse signal $T_{CAL}$ with a pulse width inversely related to a difference between the first and second input voltage signals, a time-to-voltage converter circuit 320 for providing a voltage indicator signal $V_{CAL}$ having a magnitude based on the pulse width of the time indicator pulse signal, a voltage-to-current converter circuit 330 for providing a current indicator signal $I_{CAL}$ having a magnitude proportional to the voltage indicator signal. The current indicator signal $I_{CAL}$ is configured to have a magnitude inversely related to the difference between the first and the second input voltage signals. The current indicator signal $I_{CAL}$ represents a maximum allowed current based on the pre-set maximum power limit for a voltage across the protective device.

In some embodiments, values for circuit components in the inverse voltage-to-current converter circuit are selected so that the current indicator signal represents the maximum current allowed based on the pre-set maximum power limit for a given voltage across the protective device. As an example, the selection is according to the formula:

$$P_{LMT} = I \cdot \Delta V = K_C \frac{R_1 C_1}{R_2 C_2} V_{REF} I_{REF}$$

where:
  ΔV is the voltage across the protected device;
  Kc is a current sensing ratio;
  R1, $C_1$, and VREF are a resistor, a capacitor, and a voltage reference, respectively, in the voltage-to-time converter circuit;
  $C_2$ and IREF are a capacitor and a current reference, respectively, in the time-to-voltage converter circuit; and
  R2 is a resistor in the voltage-to-current converter circuit.

Figure 4:
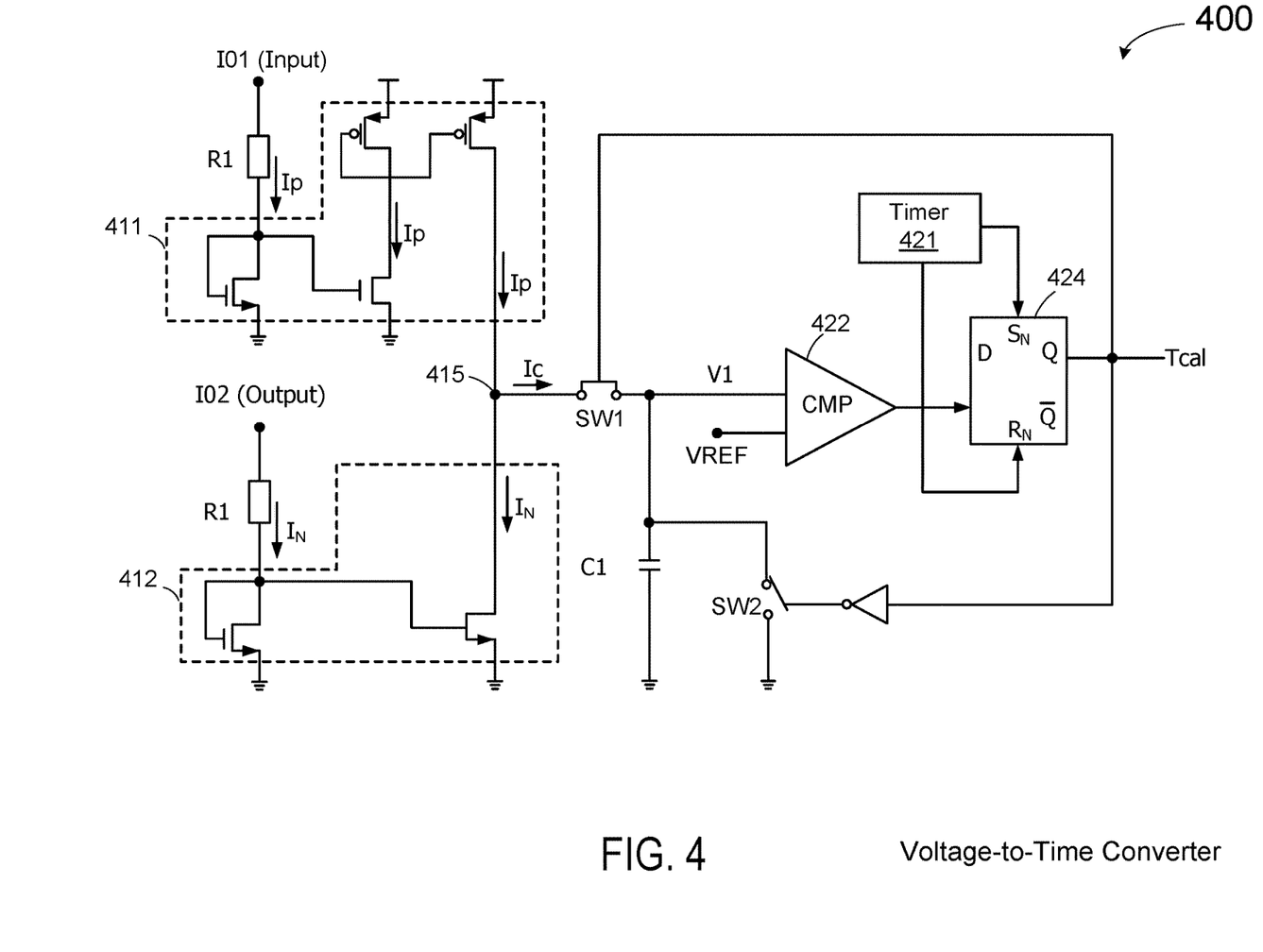
FIG. 4 is a simplified schematic diagram illustrating a voltage-to-time converter circuit for providing a voltage pulse signal with a pulse width inversely related to a magnitude of an input voltage that embodies certain aspects of this invention.

FIG. 4 is a simplified schematic diagram illustrating a voltage-to-time converter circuit for providing a voltage pulse signal with a pulse width inversely related to a magnitude of an input voltage that embodies certain aspects of this invention. The voltage-to-time converter circuit 400 in FIG. 4 is an example of circuit that can be used as the voltage-to-time conversion circuit 310 of FIG. 3. As shown in FIG. 4, the voltage-to-time conversion circuit 400 has two input terminals for coupling to two terminals of a device for monitoring the voltage across the two terminals. In FIG. 4, a first terminal marked I01 (Input) is coupled to an input terminal of the device being monitored, and a second terminal marked I02 (Output) is coupled to an output terminal of the device being monitored. These terminals correspond to the I01 and I02 terminals of the power MOSFET of FIG. 1. A first resistor R1 is connected to terminal I01 to sense a first current Ip determined by the voltage at terminal I01. Similarly, a second resistor, also having a magnitude R1, is connected to terminal I02 to sense a second current $I_N$ determined by the voltage at terminal I02. Current mirror circuits 411 and 412 are used to produce currents Ip and $I_N$ coupled at an internal node 415. A current Ic, which is equal to the difference currents Ip and $I_N$ at node 415, is used to charge a first capacitor $C_1$ through a first switch SW1. A timer circuit 421 resets and restarts the monitoring cycle periodically, e.g., each period can be 32 μsec, or other suitable time intervals. Before the start of each cycle, capacitor $C_1$ is discharged through a second switch SW2. At the start of each period, the output signal $T_{CAL}$ is set to high, and capacitor $C_1$ starts to be charged by the current Ic from node 415, which is the difference between the currents between Ip and $I_N$. As the voltage V1 on $C_1$ reaches a reference voltage VREF, comparator CMP 422 triggers the D-latch 424 to lower the output signal $T_{CAL}$. The larger the current Ic=(Ip–$I_N$), the quicker capacitor $C_1$ charges up; conversely, the smaller the current Ic=(Ip–$I_N$), the slower capacitor $C_1$ charges up. Therefore, the length, or pulse width, of output pulse signal $T_{CAL}$ is inversely related to the magnitude of current Ic=(Ip–$I_N$). As described, the voltage-to-time conversion circuit 400 of FIG. 4 converts voltage cross a power MOSFET to a pulse signal $T_{CAL}$, which is a time indicator pulse signal with a pulse width related to a charging time of the first capacitor. Further, the maximum pulse width of $T_{CAL}$ is determined by the period of the timer circuit, which can be a selectable parameter of the circuit. In FIG. 4, a second switch SW2 is used to discharge capacitor $C_1$ in response to the $T_{CAL}$ signal in every cycle.

Figure 5:
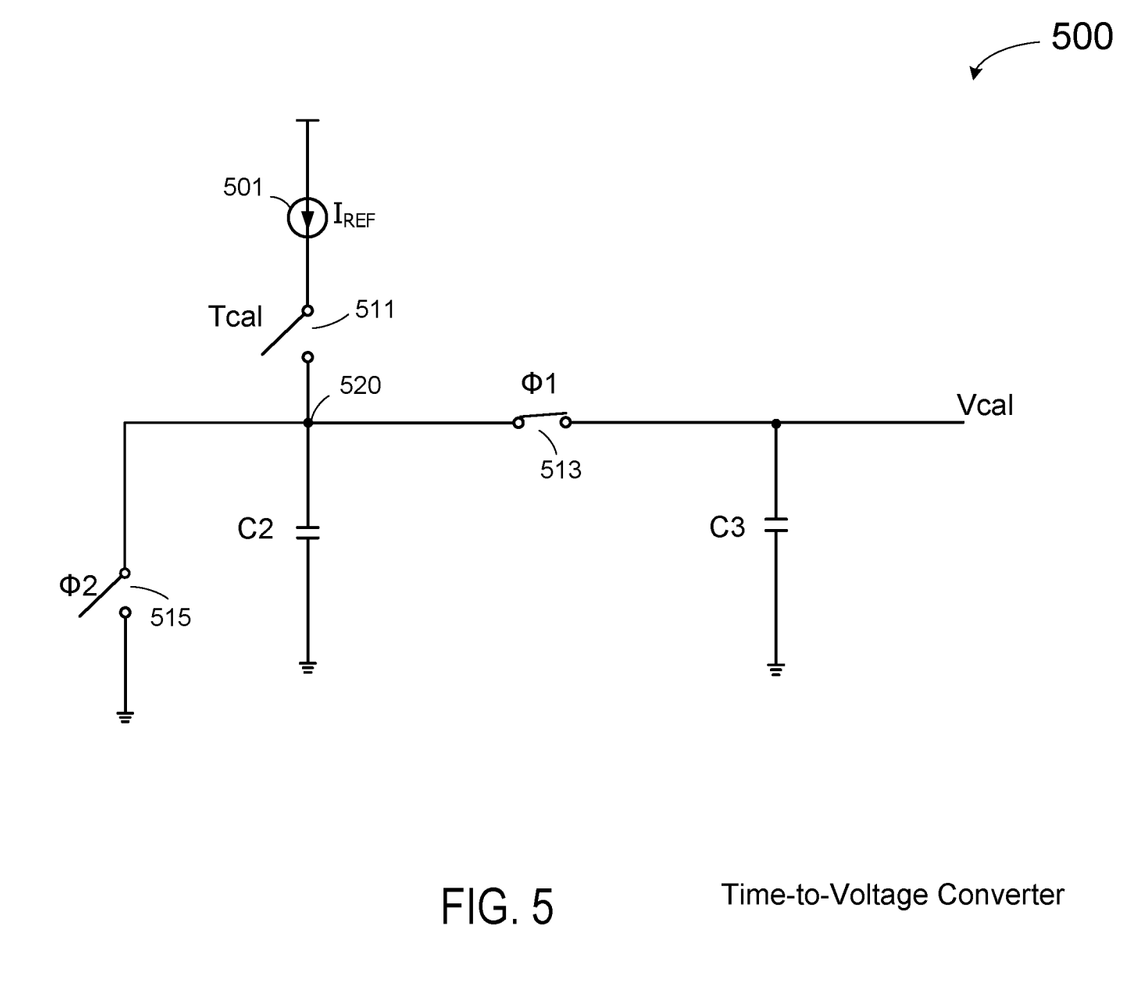
FIG. 5 is a simplified schematic diagram for a time-to-voltage converter circuit that embodies certain aspects of this invention.

FIG. 5 is a simplified schematic diagram for a time-to-voltage converter circuit that embodies certain aspects of this invention. As shown in FIG. 5, a time-to-voltage converter circuit 500 is configured for providing an output voltage having a magnitude based on a length of an input voltage pulse signal. Time-to-voltage converter circuit 500 is an example of time-to-voltage converter circuit that can be used as the time-to-voltage converter circuit 320 in FIG. 3. In FIG. 5, the time-to-voltage converter circuit 500 includes a reference current source for generating a reference current signal $I_{REF}$, a first capacitor $C_1$, and a second capacitor $C_2$. The first capacitor $C_1$ is coupled to the reference current source 501 through a first switch 511 controlled by the time indicator pulse signal $T_{CAL}$, which is provided by the voltage-to-time converter 400 in FIG. 4. The time-to-voltage converter circuit 500 is configured to charge the capacitor $C_1$ by the reference current source 501 during an on-time of the time indicator pulse signal $T_{CAL}$, and to produce a voltage 520 on the capacitor $C_1$ as the voltage indicator signal $V_{CAL}$.

The time-to-voltage converter circuit 500 also has a second switch 513 is controlled by a control signal $\Phi_1$, for controlling the transfer of charges from capacitor $C_1$ to a second capacitor $C_3$ for holding the voltage at node 520 to provide the voltage indicator signal $V_{CAL}$. A third switch 515 is controlled by a second control signal $\Phi_2$. For controlling the discharge of capacitor $C_2$ in every cycle. The time-tovoltage conversion circuit is configured to provide an output signal $V_{CAL}$, whose magnitude is based on the length of input voltage pulse signal $T_{CAL}$. The operation of the time-to-voltage conversion circuit in FIG. 3 is described below with reference to FIG. 6.

Figure 6:
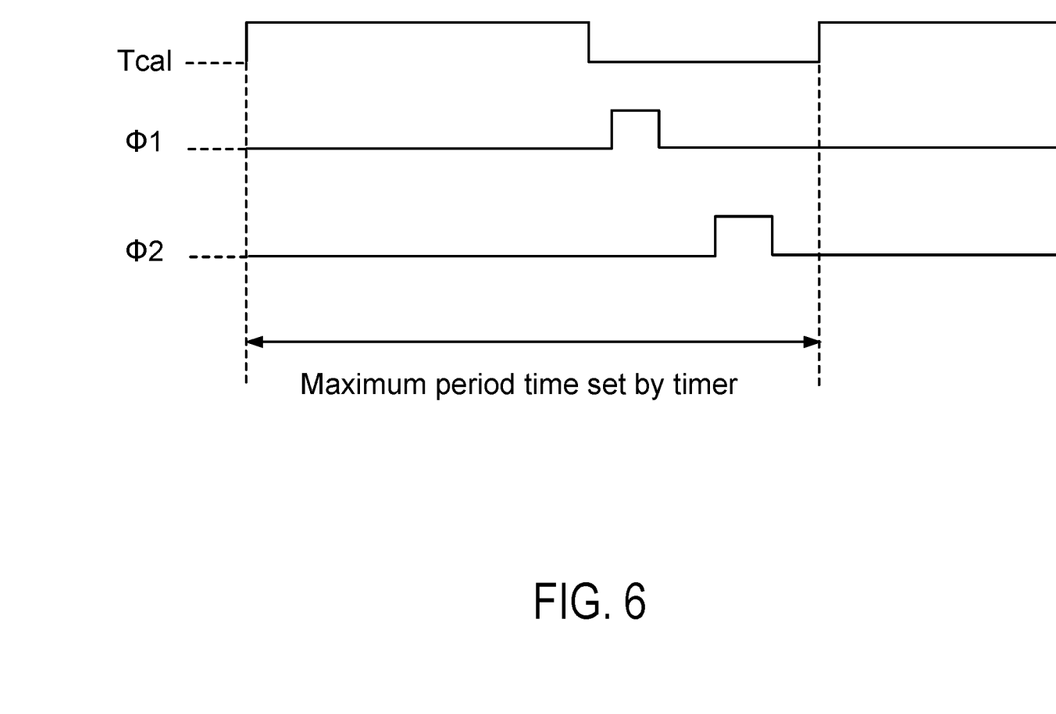
FIG. 6 is a waveform diagram illustrating the waveforms of $T_{CAL}$, $\Phi_1$, and $\Phi_2$ described above in connection to FIG. 5 that embodies certain aspects of this invention.

FIG. 6 is a waveform diagram illustrating the waveforms of $T_{CAL}$, $\Phi_1$, and $\Phi_2$ described above in connection to FIG. 5 that embodies certain aspects of this invention. It can be seen in FIG. 5 that when $T_{CAL}$ is on and $\Phi_1$ and $\Phi_2$ are off, capacitor $C_2$ is charged for a time duration $T_{CAL}$. Next, $T_{CAL}$ is low, $\Phi_1$ is turned on, and $C_3$ is charged by the voltage on $C_2$. In this circuit, $C_2 \gg C_3$. Because the capacitance of $C_3$ is much smaller than $C_2$, the voltage on $C_2$ essentially transfers to $C_3$ with negligible voltage. Then, $\Phi_2$ turns on to discharge $C_2$. The output $V_{CAL}$ at capacitor $C_3$ can be expressed as follows.

$$V_{CAL} = \frac{I_{REF}}{C_2} T_{CAL}$$

In this circuit, $C_3 \ll C_2$. For example, the capacitance of $C_2$ can be 10 times the capacitance of $C_3$. In a specific example, $C_2$ may have a capacitance of 10 pF, and $C_3$ may have a capacitance of 1 pF. The output voltage $V_{CAL}$ can be held by a small capacitor $C_3$ for processing in the next stage.

Figure 7:
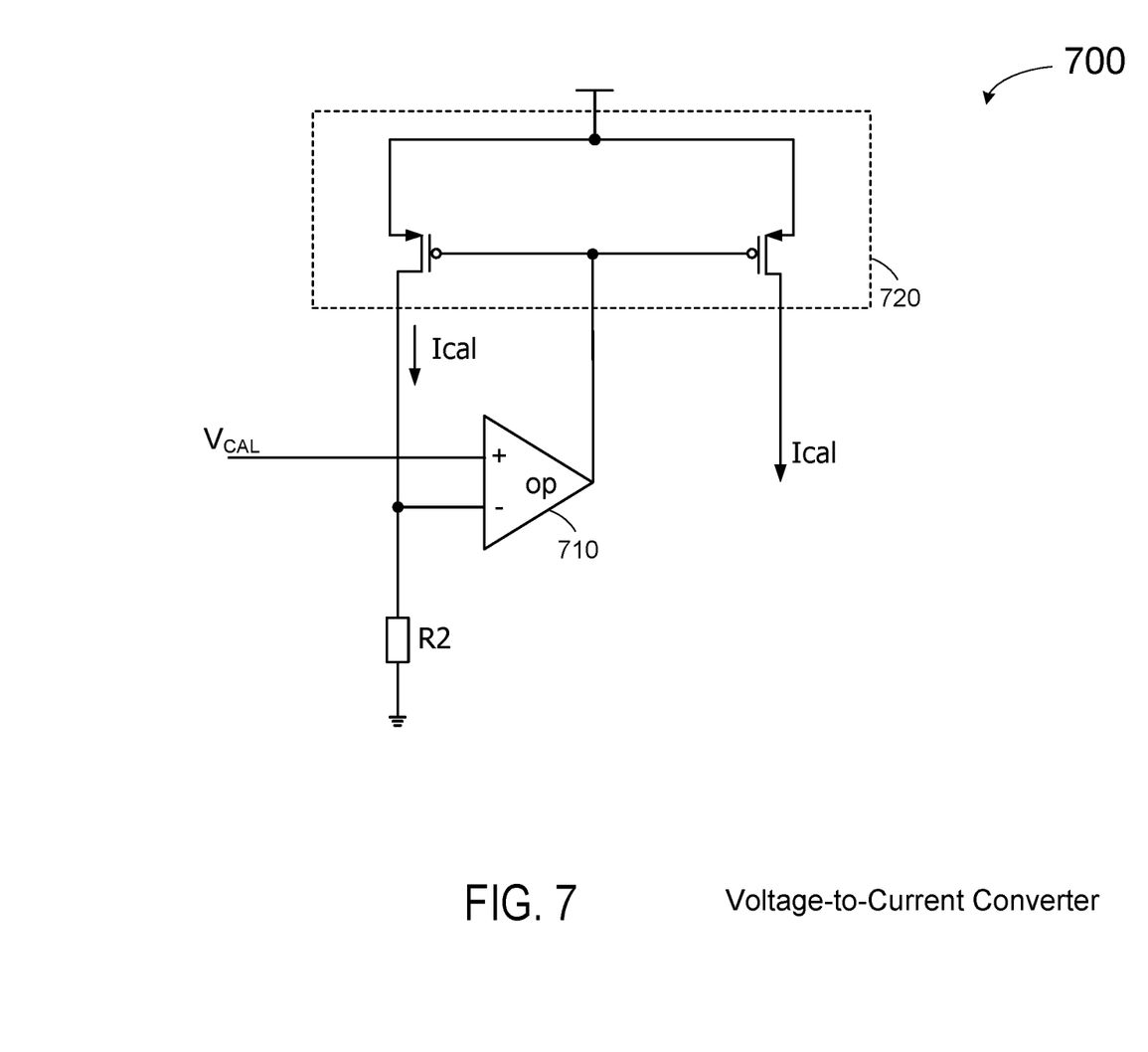
FIG. 7 is a simplified schematic diagram illustrating a voltage-to-current converter circuit that embodies certain aspects of this invention.

FIG. 7 is a simplified schematic diagram illustrating a voltage-to-current converter circuit that embodies certain aspects of this invention. The voltage-to-current converter circuit 700 is an example of voltage-to-current converter circuit that can be used as the voltage-to-current converter circuit 330 of FIG. 3. In this example, the voltage-to-current converter circuit 700 a current regulator includes a current regulator for providing a current signal $I_{CAL}$ having a magnitude proportional to the an input voltage $V_{CAL}$, which can be an output from the time-to-voltage converter circuit of FIG. 5. The current signal $I_{CAL}$ has a magnitude inversely related to the input voltage of the inverse voltage-to-current converter circuit 122 illustrated in FIG. 1 and the inverse voltage-to-current converter circuit 300 illustrated in FIG. 3.

In FIG. 7, $V_{CAL}$ is an input to an operational amplifier 710 at the + input. The current $I_{CAL}$ is provided by a current mirror 720 and coupled to a resistor R2. Current mirror 720 is coupled to the output of the operational amplifier 710 in a feedback loop. The current $I_{CAL}$ is determined such that the voltage at the − input of the operation amplifier 710 is equal to $V_{CAL}$. Therefore, $$I_{CAL} = \frac{V_{CAL}}{R_2}$$

$I_{CAL}$ is provided at the output by a current mirror circuit 720. Thus, the voltage-to-current converter circuit 700 produces an output current $I_{CAL}$ proportional to the voltage indicator signal $V_{CAL}$.

Figure 8:
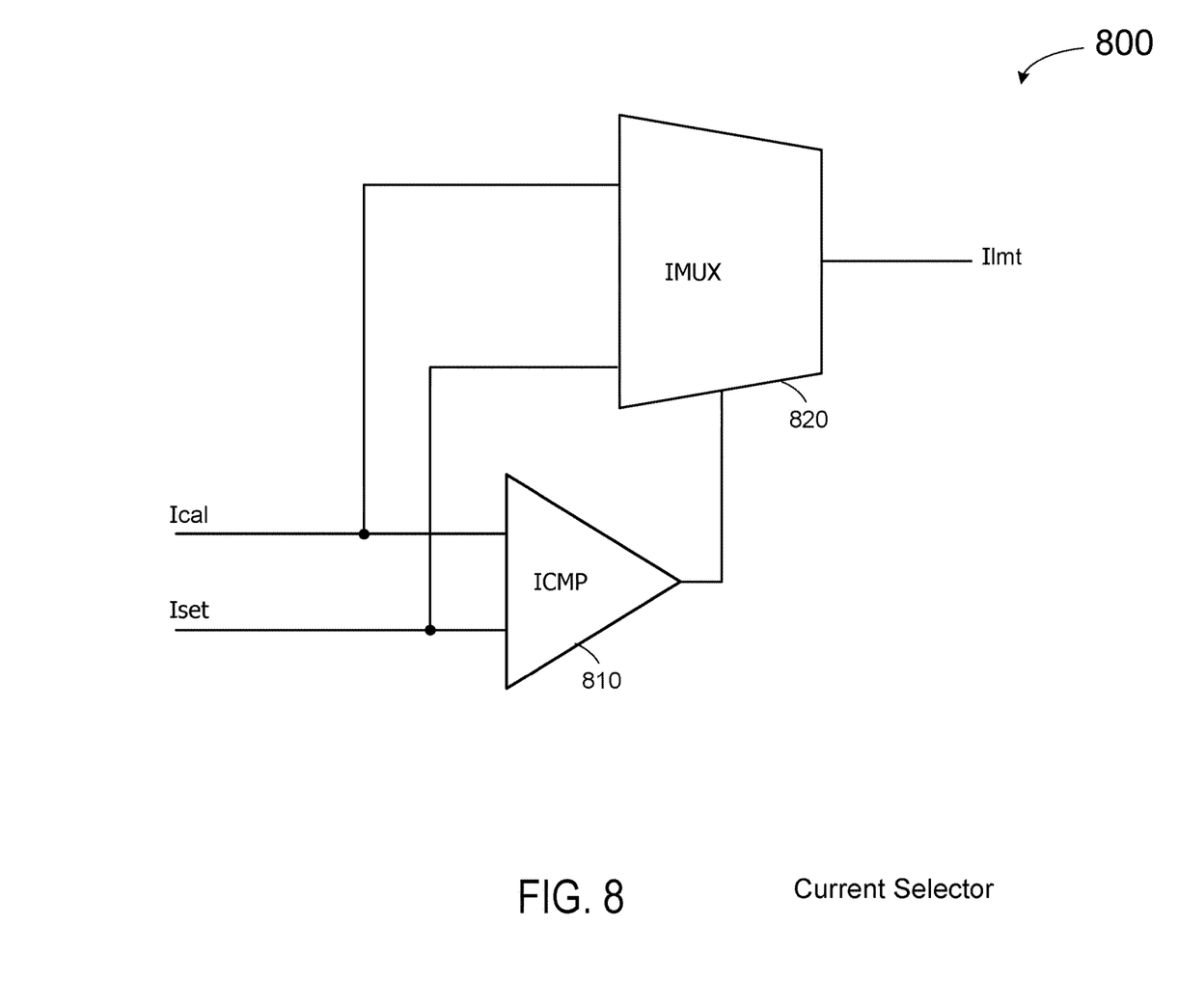
FIG. 8 is a simplified schematic diagram of a current selector circuit that embodies certain aspects of this invention.

FIG. 8 is a simplified schematic diagram of a current selector circuit that embodies certain aspects of this invention. The current selector circuit 800 is an example of current limit selector circuit that can be used as the current limit setting circuit 124 of FIG. 1. As shown in FIG. 8, the current selector circuit includes a current comparator circuit ICMP (810) and a multiplexor circuit IMUX (820). The current comparator 810 is used to compare $I_{CAL}$ to $I_{SET}$, the current limit $I_{SET}$ can be provided to the circuit either internally or externally on system board. The current multiplexer 820 to choose the smaller one between $I_{CAL}$ to $I_{SET}$. To be the target current limit signal $I_{LMT}$. The functions of the current selector circuit can be described with the following expressions.

If $I_{CAL} < I_{SET}$, set $I_{LMT} = I_{CAL}$;

If $I_{CAL} \geq I_{SET}$, set $I_{LMT} = I_{SET}$;

In other words, the lower of the two input signals $I_{CAL}$ and $I_{SET}$ is used as the current limit provided to the over-current protection circuit.

Referring to FIG. 1, in the protection circuit 100, the smaller one between $I_{CAL}$ to $I_{SET}$ is sent to the over-current protection circuit 110 to control the gate of power MOSFET in order to limit current through power MOSFET 20 at a current limit $I_{LMT}$.

Given a power limit, the values of the components in the over-power protection circuit can be determined to provide a target current limit signal to the over-current protection circuit 110 to control the gate of power MOSFET in order to limit the power to not exceed the power limit. From the equations described above.

$$T_{CAL} = R_1 C_1 \frac{I_{REF}}{\Delta V}$$

$$V_{CAL} = \frac{I_{REF}}{C_2} T_{CAL}$$

$$I_{CAL} = \frac{V_{CAL}}{R_2}$$

where $\Delta V$ is the voltage across the protected device.

We can have $$I_{CAL} = \left( \frac{R_1 C_1}{R_2 C_2} V_{REF} I_{REF} \right) \Big/ \Delta V$$

Let the sensing current ratio be defined as $K_C$, $$K_C = \frac{I}{I_{SENSE}}$$

in which I is the current flowing through the power MOSFET.

When the over-current protection (OCP) condition occurs with the current limit set by $I_{CAL}$, we have the following relationship:

$$P_{LMT} = I_{CAL} \, \Delta V = K_C \frac{R_1 C_1}{R_2 C_2} V_{REF} I_{REF}$$

where $\Delta V$ is the voltage across the protected device.

With a given $P_{LMT}$, the appropriate values of the parameters can be selected. With these parameters, $I_{CAL}$ can be generated reversely proportional to $\Delta V$. For example, depending on the embodiments, Kc can be between $10^4$ to $10^6$, R1 and R2 can be 20 KΩ to 800 KΩ, $C_1$ and $C_2$ can be 1 pF to 10 pf, $V_{REF}$ can be 1 V to 5V, and $I_{REF}$ can be 1 µA to 5 µA, etc.

In these embodiments, $I_{CAL}$ can be made to be less dependent to variations in process conditions, supply voltage, and operating temperature. For example, $R_1$, $R_2$, $C_2$ and $C_2$ can be designed to match each other, $V_{REF}$ can be determined from a bandgap voltage circuit, and $I_{REF}$ can be derived from a bandgap voltage crossing a zero-Tc resistor.

What is claimed is:

1. A protection circuit, comprising:
    an over-current protection circuit for coupling to a protected device, the protected device having a pre-set maximum current limit and a pre-set maximum power limit; and
    a current limit setting circuit coupled to the over-current protection circuit and the protected device, the current limit setting circuit comprising an inverse voltage-to-current converter circuit for providing a current that is inversely related to a measured voltage across the protective device for determining a current indicator signal based on the pre-set maximum power limit divided by the measured voltage across the protected device,
    the current limit setting circuit configured to provide a target current limit signal to the over-current protection circuit for limiting current through the protected device, the target current limit signal being the lower one of:
    the pre-set maximum current limit, and
    the current indicator.

2. The circuit of claim 1, wherein values for circuit components in the over-current protection circuit are selected so that the current indicator signal represents a maximum current allowed based on the pre-set maximum power limit divided by the measured voltage across the protective device.

3. The circuit of claim 1, wherein the protected device includes a MOSFET circuit.

4. The circuit of claim 1, wherein the over-current protection circuit comprises:
    a current control circuit configured to generate a current control signal in response to comparing a sensed current signal in the protected device with the target current limit signal; and
    a device driver circuit configured to receive the current control signal and to control current flow in the protected device.

5. The circuit of claim 4, wherein the sensed current signal and the target current limit signal are current signals.

6. The circuit of claim 4, wherein the current control circuit comprises:
    a current sense circuit configured to sense a current in the protected device to determine the sensed current signal; and
    a comparator circuit configured to compare the sensed current signal in the protected device with the target current limit signal, and to generate a current control signal.

7. The circuit of claim 6, wherein the comparator circuit comprises a current comparator circuit configured to receive two current signals and generate the current control signal that can have a first voltage value and a second voltage value.

8. The circuit of claim 4, wherein the device driver circuit comprises:
    a charge pump circuit for providing either one of a high device drive signal or a low device drive signal in response to the current control signal to control the current in the protected device.

9. The circuit of claim 1, wherein the current limit setting circuit further comprises:
    a current limit selector circuit configured to select a lower one of the pre-set maximum current limit and the current indicator signal.

10. The circuit of claim 9, wherein the inverse voltage-to-current converter circuit comprises:
    a first terminal and a second terminal for receiving a first input voltage signal and a second input voltage signal from the protected device;
    a voltage-to-time converter circuit for providing a time indicator pulse signal with a pulse width inversely related to a difference between the first and second input voltage signals;
    a time-to-voltage converter circuit for providing a voltage indicator signal having a magnitude based on the pulse width of the time indicator pulse signal;
    a voltage-to-current converter circuit for providing the current indicator signal having a magnitude proportional to the voltage indicator signal, the current indicator signal being configured to have a magnitude inversely related to the difference between the first and the second input voltage signals; and
    the current indicator signal representing a maximum allowed current based on the pre-set maximum power limit for the voltage across the protective device.

11. The circuit of claim 10, wherein values for circuit components in the inverse voltage-to-current converter circuit are selected so that the current indicator signal represents the maximum current allowed based on the pre-set maximum power limit for a given voltage across the protected device.

12. The circuit of claim 11, wherein the selection is according to the formula:

$$P_{LMT} = I \, \Delta V = K_C \frac{R_1 C_1}{R_2 C_2} V_{REF} I_{REF}$$

where:
    $\Delta V$ is the voltage across the protected device;
    Kc is a current sensing ratio;
    R1, $C_1$, and VREF are a resistor, a capacitor, and a voltage reference, respectively, in the voltage-to-time converter circuit;
    $C_2$ and IREF are a capacitor and a current reference, respectively, in the time-to-voltage converter circuit; and
    R2 is a resistor in the voltage-to-current converter circuit.

13. The circuit of claim 10, wherein the voltage-to-time converter circuit comprises:
    a first resistor coupled to the first input voltage signal for sampling a first current;
    a second resistor coupled to the second input voltage signal for sampling a second current;
    a first capacitor configured to be charged by a difference between the first current and the second current; and
    a latch configured to produce the time indicator pulse signal with a pulse width related to a charging time of the first capacitor.

14. The circuit of claim 10, wherein the time-to-voltage converter circuit comprises:
    a reference current source for generating a reference current signal; and
    a capacitor coupled to the reference current source through a switch controlled by the time indicator pulse signal;

wherein the time-to-voltage converter circuit is configured to charge the capacitor by the reference current source during an on-time of the time indicator pulse signal, and to produce a voltage on the capacitor as the voltage indicator signal.

15. The circuit of claim 10, wherein the voltage-to-current converter circuit comprises a current regulator including an operational amplifier configured to produce an output current proportional to the voltage indicator signal.

16. An over-power protection circuit for a MOSFET, comprising: an over-current protection circuit and a current limit setting circuit; and the over-power protection circuit configured to: continuously monitor a voltage across the MOSFET being protected to prevent over-power conditions; and dynamically determine a maximum current limit based on a pre-set maximum power limit divided by the monitored voltage across the MOSFET and; wherein: the over-current protection circuit is configured to sense a current flowing through a protected device; compare the sensed current with a target current limit; and limit the current through the protected device to below the target current limit; and the current limit setting circuit is configured to provide the target current limit to the over-current protection circuit, wherein the target current limit is a lower one of a pre-set current limit from a device specification and a second current limit based on the pre-set maximum power limit divided by a voltage across the MOSFET.

17. The over-power protection circuit of claim 16, wherein the current limit setting circuit comprises:
an inverse voltage-to-current converter circuit configured to provide a current that is inversely related to a measured voltage across the MOSFET and to provide the second current limit determined based on the pre-set maximum power limit and the voltage across the protected device; and
a current limit selector circuit configured to select the lower one of the pre-set current limit and the second current limit.

18. A protection circuit, comprising:
an over-current protection circuit for coupling to a protected device, the protected device having a pre-set maximum current limit and a pre-set maximum power limit; and
a current limit setting circuit coupled to the over-current protection circuit and the protected device, the current limit setting circuit configured to provide a target current limit signal to the over-current protection circuit for limiting current through the protected device, the target current limit signal being the lower one of:
the pre-set maximum current limit, and
a current indicator signal determined based on the pre-set maximum power limit and a voltage across the protected device;
wherein the current limit setting circuit comprises:
an inverse voltage-to-current converter circuit configured to provide the current indicator signal based on the pre-set maximum power limit and the voltage across the protected device; and
a current limit selector circuit configured to select a lower one of the pre-set maximum current limit and the current indicator signal;
wherein the inverse voltage-to-current converter circuit comprises:
a first terminal and a second terminal for receiving a first input voltage signal and a second input voltage signal from the protected device;
a voltage-to-time converter circuit for providing a time indicator pulse signal with a pulse width inversely related to a difference between the first and second input voltage signals;
a time-to-voltage converter circuit for providing a voltage indicator signal having a magnitude based on the pulse width of the time indicator pulse signal;
a voltage-to-current converter circuit for providing the current indicator signal having a magnitude proportional to the voltage indicator signal, the current indicator signal being configured to have a magnitude inversely related to the difference between the first and the second input voltage signals;
the current indicator signal representing a maximum allowed current based on the pre-set maximum power limit for the voltage across the protective device.

* * * * *